United States Patent
Maki

(10) Patent No.: US 8,525,094 B2
(45) Date of Patent: Sep. 3, 2013

(54) PHOTOELECTRIC CONVERSION CIRCUIT

(75) Inventor: Tatsuyuki Maki, Atsugi (JP)

(73) Assignee: Anritsu Corporation, Kanagawa (JP)

( * ) Notice: Subject to any disclaimer, the term of this patent is extended or adjusted under 35 U.S.C. 154(b) by 72 days.

(21) Appl. No.: 13/286,644

(22) Filed: Nov. 1, 2011

(65) Prior Publication Data
US 2012/0273659 A1 Nov. 1, 2012

(30) Foreign Application Priority Data

Nov. 12, 2010 (JP) .................................. 2010-253934

(51) Int. Cl.
| G01J 1/44 | (2006.01) |
| H03K 17/78 | (2006.01) |
| H03F 3/08 | (2006.01) |
| H03K 19/14 | (2006.01) |

(52) U.S. Cl.
USPC ............... 250/214 A; 250/214 R; 250/214 LS

(58) Field of Classification Search
USPC ............ 250/214 R, 214 LS, 214 A; 327/514; 361/173, 174; 330/59, 61 R
See application file for complete search history.

(56) References Cited

U.S. PATENT DOCUMENTS

| 5,773,816 | A | * | 6/1998 | Grodevant | ................ | 250/214 R |
| 6,300,615 | B1 | * | 10/2001 | Shinohara et al. | ......... | 250/214 R |
| 6,350,981 | B1 | * | 2/2002 | Uno | ......................... | 250/214 R |
| 7,196,309 | B2 | * | 3/2007 | Kugelstadt | ................ | 250/214 R |
| 8,153,954 | B2 | * | 4/2012 | Amano et al. | ............. | 250/214 R |

FOREIGN PATENT DOCUMENTS

| JP | H07-092075 A | 4/1995 |
| JP | 2007-300340 A | 11/2007 |

* cited by examiner

Primary Examiner — Dameon Levi
Assistant Examiner — Carolynn Moore
(74) Attorney, Agent, or Firm — Pearne & Gordon LLP

(57) ABSTRACT

There are provided a photodiode 11, an inverting amplifier 12 which includes an operational amplifier 12a and a first resistor 12b, a second resistor 21 which has a smaller resistance value than the first resistor 12b and which is inserted between the positive side of a power supply and the photodiode 11, a differential amplifier 22 which outputs a voltage across both ends of the second resistor 21, and a diode 23 which is connected between a ground and a connection point between the photodiode 11 and an inverting input terminal of the operational amplifier 12a and which changes to a non-conductive state when the inverting amplifier 12 is not saturated and changes to a conductive state when the inverting amplifier 12 is saturated so that the output current of the photodiode 11 is bypassed.

1 Claim, 6 Drawing Sheets

PHOTOELECTRIC CONVERSION CIRCUIT

TECHNICAL FIELD

The present invention relates to a technique for eliminating delays caused by range switching processing while ensuring a wide dynamic range in a photoelectric conversion circuit which outputs an electric signal with a size corresponding to the intensity of incident light.

BACKGROUND ART

In an optical spectrum analyzer or an optical power meter which measures the intensity of light, an I/V (current/voltage) conversion type photoelectric conversion circuit which outputs a voltage signal proportional to the intensity of incident light is used.

As shown in FIG. 6, the I/V conversion type photoelectric conversion circuit includes a photodiode 11, which has a cathode connected to a positive voltage Va(+) of a power supply and which outputs a current Ip proportional to the intensity of incident light from its anode side, and an inverting amplifier 12 using an operational amplifier 12a, which has a non-inverting input terminal grounded, and a feedback resistor 12b. By supplying the output current Ip of the photodiode 11 to the input of the inverting amplifier 12, a voltage Vout equivalent to "−Ip×R" is output at the output terminal.

In the inverting amplifier using the operational amplifier, the inverting input terminal and the non-inverting input terminal are virtually short-circuited. When the non-inverting input terminal is grounded and the electric potential is fixed to 0 V, the electric potential of the inverting input terminal also becomes 0 V and the input resistance is too large. Accordingly, the current Ip flowing from the photodiode 11 flows to the output terminal through the feedback resistor 12b of the operational amplifier 12a. As a result, the voltage Vout equivalent to "−Ip×R" is output.

In such an I/V conversion type photoelectric conversion circuit, the dynamic range of the photodiode 11 generally has a size of 80 dB or more in terms of input light power (the same hereinbelow). However, since the effective dynamic range at the amplifier side is about 30 to 40 dB, it is necessary to perform range switching at the amplifier side when performing photoelectric conversion corresponding to the entire dynamic range of the photodiode 11.

For example, as shown in FIG. 7, two feedback resistors 12c and 12d with different resistance values Ra and Rb (Ra<Rb) are set so as to be selectable by a switch 12e. In this case, in a range (non-saturated region) where the output current Ip of the photodiode 11 is lower than a certain threshold value Ith (for example, Ith=Vb(−)/Rb) due to the low intensity of incident light, the output voltage of Vout=−Ip×Rb is obtained using the feedback resistor 12d with the larger resistance value.

Moreover, in a range where the output current Ip of the photodiode 11 exceeds the threshold value Ith due to the high intensity of incident light (however, not exceeding Vb(−)/Ra), the output voltage of Vout=−Ip×Ra is obtained using the feedback resistor 12c with the smaller resistance value. Here, it is assumed that Vb(+) and Vb(−) are supply voltages (the same positive and negative voltages) of the inverting amplifier 12 and are equal to the saturation power voltage.

For example, assuming that Ra=100Ω, Rb=1 MΩ, and supply voltage of an amplifier=saturation voltage=Vb(−)=−10 V, a non-saturated output voltage up to −10 V can be obtained for the current Ip equal to or lower than |Vb(−)|/Rb=10 V/1 MΩ=10 µA when the feedback resistor 12d with the resistance value Rb is connected.

In addition, when the feedback resistor 12c with the resistance value Ra is connected, a non-saturated output voltage up to −10 V can be obtained for the current Ip equal to or lower than |Vb(−)|/Ra=10 V/100Ω=100 mA.

When the effective dynamic range of the amplifier is set to 40 dB (10000 times) in consideration of the level of residual noise and the like, the effective output range becomes −10 V to −1 mV. In this case, since the output voltage −1 mV when the feedback resistor 12d is connected is equivalent to 1 mV/1 MΩ=1 nA, the output voltage of −1 mV to −10 V is obtained for a range of 1 nA to 10 µA of the output current Ip of the photodiode.

In addition, since the output voltage −1 mV when the feedback resistor 12c is connected is equivalent to 1 mV/100Ω=10 µA, the output voltage of −1 mV to −10 V is obtained for a range of 10 µA to 100 mA of the output current Ip of the photodiode.

Accordingly, when the intensity of incident light is in a range of 1 nA to 10 µA in terms of an output current of the photodiode 11, the switch 12e is connected to the feedback resistor 12d (high gain side) and the output voltage of the operational amplifier 12a at that time is selected as an effective output. When the intensity of incident light is in a range of 10 µA to 100 mA in terms of an output current of the photodiode 11, the switch 12e is connected to the feedback resistor 12c (low gain side) and the output voltage of the operational amplifier 12a at that time is selected as an effective output.

Here, the output when the feedback resistor 12c is connected is reduced to Ra/Rb (=1/10000) of the output when the feedback resistor 12d is connected. Therefore, in order to obtain an output corresponding to the actual intensity of incident light, it is necessary to perform conversion as Rb/Ra times using a subsequent operation circuit (absolute value processing for removing a negative sign is also performed when necessary).

In addition, a technique of expanding the dynamic range at the amplifier side by switching (ranging) between feedback resistors of an I/V conversion circuit as described above is disclosed in JP-A-2007-300340, for example.

RELATED ART DOCUMENT

Patent Document

[Patent Document 1] JP-A-2007-300340

DISCLOSURE OF THE INVENTION

Problem that the Invention is to Solve

In the photoelectric conversion circuit with the configuration described above, however, only a voltage signal in one gain state can be output theoretically for the output current of the photodiode 11. For this reason, it is necessary to monitor the output continuously. Specifically, when the output voltage is in a proper range, that is, a voltage range of −1 mV to −10 V, the current feedback resistor is maintained since the output voltage is effective. When the output voltage is not in the proper range, for example, when the output voltage is higher than −1 mV or when the output voltage is equal to −10 V (saturation voltage), processing for switching the current feedback resistor to the other feedback resistor and checking whether or not it is in the proper range is needed.

Accordingly, a correct output voltage proportional to the current Ip when it is determined that the output voltage is not in the proper range cannot be acquired, and only an output voltage after feedback resistor switching is obtained. That is, the photoelectric conversion circuit with the configuration described above can handle light whose intensity is constant or changes gradually, but an electric signal which is correctly proportional to the intensity cannot be acquired for light whose level changes greatly at high speed exceeding the range.

In order to solve this problem, it is an object of the present invention to provide a photoelectric conversion circuit capable of coping with a case of large level change by eliminating delays caused by range switching processing while ensuring a wide dynamic range.

Means for Solving the Problems

In order to achieve the above object, a photoelectric conversion circuit of the present invention includes: a photodiode (11) which has a cathode connected to a positive side of a power supply and which receives incident light and emits a current corresponding to the intensity from an anode side; an inverting amplifier (12) which includes an operational amplifier (12a) having a non-inverting input terminal grounded and a first resistor (12b) connected between an output terminal and an inverting input terminal of the operational amplifier and which outputs a voltage whose absolute value is equal to a product of an output current of the photodiode and a resistance value of the first resistor, the inverting input terminal of the operational amplifier being connected to the anode of the photodiode; a second resistor (21) which has a smaller resistance value than the first resistor and which is inserted between the positive side of the power supply and the cathode of the photodiode; a differential amplifier (22) which outputs a voltage whose absolute value is equal to a potential difference between both of the second resistor; and a diode (23) which has an anode connected to a connection point between the anode of the photodiode and the inverting input terminal of the operational amplifier and a cathode grounded and which, when the output current of the photodiode has not reached a level which saturates an output of the inverting amplifier, changes to a non-conductive state since a voltage of the inverting input terminal of the operational amplifier is lower than a forward voltage drop unique to the diode, when the output current of the photodiode reaches the level which saturates the output of the inverting amplifier, changes to a conductive state since the voltage of the inverting input terminal of the operational amplifier is higher than the forward voltage drop so that the output current of the photodiode is bypassed.

Advantage of the Invention

Since the photoelectric conversion circuit of the present invention is configured as described above, the diode changes to a non-conductive state in the range where the output current of the photodiode does not saturate the inverting amplifier and accordingly, a voltage equal to the product of the output current of the photodiode and the resistance value of the first resistor can be output as an output of the inverting amplifier in the same manner as in the related art. In the range where the inverting amplifier is saturated, the diode changes to a conductive state so that the output current of the photodiode is bypassed. Accordingly, even if the inverting amplifier is in a saturation state, a current corresponding to the input light intensity is obtained continuously. As a result, a voltage whose absolute value is equal to the product of the current and the resistance value of the second resistor can be obtained.

In addition, since outputs with respect to these different ranges are obtained in parallel without range switching processing, a processing time for switching is not required, and it is possible to output a signal whose voltage changes correctly corresponding to the light intensity which fluctuates greatly exceeding the range.

BEST MODE FOR CARRYING OUT THE INVENTION (First Embodiment)

Figure 1:
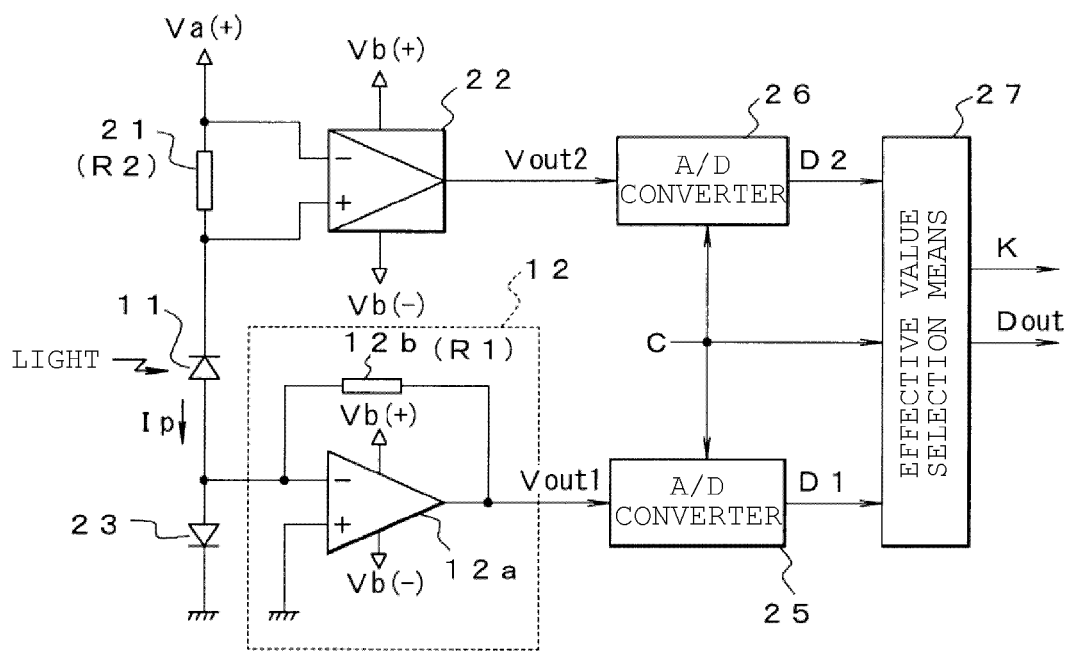
FIG. 1 is a view showing the configuration of a first embodiment of the present invention.

Hereinafter, a first embodiment of the present invention will be described with reference to the accompanying drawings. FIG. 1 shows a configuration of a photoelectric conversion circuit 20 to which the present invention is applied.

In FIG. 1, a cathode of a photodiode 11 which receives incident light is connected to a line at the positive side Va(+) of a power supply through a second resistor 21, which will be described later, and a current Ip corresponding to the intensity of the received incident light is emitted from the anode side.

The anode of the photodiode 11 is connected to an inverting amplifier 12 for I/V conversion. The inverting amplifier 12 includes an operational amplifier 12a, which has a non-inverting terminal grounded and to which positive and negative voltages Vb(+) and Vb(−) are applied, and a first resistor 12b, which makes a connection between an output terminal and an inverting input terminal of the operational amplifier 12a and which has a resistance value R1. The current Ip output from the anode of the photodiode 11 is input to the inverting input terminal of the operational amplifier 12a, the current Ip flows to the output terminal through a first resistor 12b, and a voltage Vout1=−Ip×R1 whose absolute value is equal to the product of the current Ip and the resistance value R1 is output.

The second resistor 21 has a sufficiently small resistance value R2 (for example, about 100Ω which is 1/10000 of R1=1 MΩ) compared with the first resistor 12b of the inverting amplifier 12. The second resistor 21 is inserted between the positive side Va(+) of the power supply and the cathode of the photodiode 11 to generate a potential difference Ip×R2, which is proportional to the output current Ip of the photodiode 11, across both ends. In addition, it is assumed that the resistance value R2 is set so as to be small compared with the resistance value R1 of the first resistor 12b and so that the operating point of the photodiode 11 can be kept in a proper range by the resistance value itself, as will be described later.

The potential difference generated across both the ends of the second resistor 21 is input to a differential amplifier 22 with a gain 1, and a voltage Vout2=−Ip×R2 whose absolute value is equal the potential difference is output. A power supply of the differential amplifier 22 is the same as the power supply of the inverting amplifier 12. Here, the polarity of an output voltage of the differential amplifier 22 is set so as to be equal to the polarity of an output voltage of the inverting amplifier 12.

Thus, two kinds of voltage signals Vout1 and Vout2 proportional to the output current Ip of the photodiode 11 are output, and the ratio ($\alpha$=R1/R2) between the resistance values R1 and R2 as the proportionality coefficient is set to be very large (for example, 10000). In addition, since the maximum negative voltage that can be output by each voltage signal is a saturation voltage, that is, a supply voltage Vb(−), outputs in the same voltage range can be obtained in parallel for different input ranges with the ratio $\alpha$ of R1/R2. Theoretically, the lower limit of the negative output voltage range is 0 V. However, since the influence of noise cannot be ignored in practice, the ratio of upper and lower limits of the output range is set to be equal to $\alpha$ (=R1/R2) so that the ranges of both output voltages (these become proper ranges) become the same. That is, assuming that the upper limit is Vb(−), the lower limit becomes $1/\alpha$, that is, Vb(−)/$\alpha$.

Here, the output of the inverting amplifier 12 is saturated at the supply voltage Vb(−), and the output-side voltage is still the supply voltage Vb(−) even if the output current Ip of the photodiode 11 increases. For this reason, since it is not possible to maintain the virtual short-circuited state described above, the electric potential of the inverting input terminal of the operational amplifier 12a rises from 0 V according to the current and the voltage applied between both ends of the photodiode 11 drops. The voltage applied between both ends of the photodiode 11 determines the operating point of the photodiode 11. Since the output current is also reduced if the applied voltage drops greatly, a current corresponding to the input light intensity cannot be acquired. As a result, the output of the differential amplifier 22 which detects a voltage drop by the current becomes inaccurate.

In order to solve this, in the present embodiment, an anode of a diode 23 is connected to a connection point between the anode of the photodiode 11 and the inverting input terminal of the operational amplifier 12, and a cathode of the diode 23 is grounded.

By connecting the diode 23 as described above, the voltage applied to the anode of the diode 23 becomes 0 V due to a virtual short-circuit of the operational amplifier 12a in a range where the output current Ip of the photodiode 11 has not reached a level which saturates the output of the inverting amplifier 12. Since this is lower than a forward voltage drop (for example, 0.1 V) unique to the diode element, the diode 23 changes to a non-conductive state. In this case, the I/V conversion operation by the photodiode 11 and the inverting amplifier 12 is not affected.

On the other hand, if the output current Ip of the photodiode 11 is further increased after reaching the level which saturates the output of the inverting amplifier 12, the electric potential of the inverting input terminal of the operational amplifier 12a tends to rise as described above. However, since the diode 23 changes to a conductive state when the electric potential becomes higher than the forward voltage drop unique to the diode 23, the output current Ip of the photodiode 11 is bypassed.

Here, the forward voltage drop of the diode 23 can be set to be extremely close to 0 V by using a Schottky barrier diode, for example. In addition, since the voltage is almost constant even if a current changes, the electric potential at the cathode side of the photodiode 11 hardly changes in a state where the inverting amplifier 12 is saturated. The voltage at the anode side of the photodiode 11 becomes lower due to the voltage drop caused by the second resistor 21. However, since the resistance value of the second resistor 21 is set as small as about 100Ω (or may be less than 100Ω) as described above, the voltage drop is small. As a result, since the voltage applied between both ends of the photodiode 11 does not deviate from the proper operating point, a current proportional to the input light intensity can be output.

Accordingly, even if light with an intensity which saturates the inverting amplifier 12 is input, the output voltage Vout2 proportional to the intensity can be acquired.

The output of the inverting amplifier 12 and the output of the differential amplifier 22 are sampled in synchronization with a clock C with a predetermined frequency (sufficiently high-speed clock for an intensity change of light input to the photodiode 11) by A/D converters 25 and 26, are converted into digital values D1 and D2, respectively, and are output to effective value selection means 27.

The effective value selection means 27 stores the input digital values D1 and D2 in an internal buffer, selects the value included in a proper range (in the above example, a range lower than Vb(−) and equal to or higher than Vb(−)/$\alpha$), and outputs it as an effective value Dout together with magnification information K.

Here, the magnification information K is data of "0" indicating the magnification 1 when the digital value D1 is selected as an effective value and is data of "1" indicating the magnification $\alpha$ (=R1/R2) when the digital value D2 is selected as an effective value, for example.

Next, a numerical example of the photoelectric conversion circuit 20 with the configuration described above will be described briefly.

For example, it is assumed that R1=1 MΩ, R2=100Ω ($\alpha$=10000), and supply voltage Vb(−) of the inverting amplifier 12 and the differential amplifier 22=saturation voltage=−10 V. In addition, it is assumed that the power supply Va(+) of the photodiode 11 is set sufficiently high (for example, 24 V) expecting a voltage drop by the second resistor 21.

Figure 2:
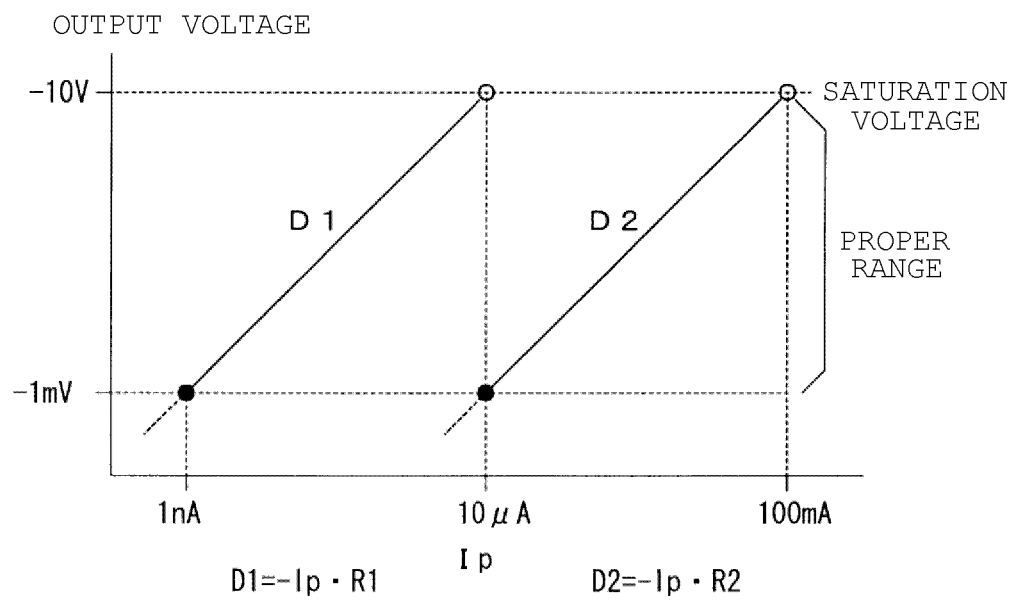
FIG. 2 is a view for explaining an operation of the first embodiment.

Under the above conditions, as shown in FIG. 2, when the output current Ip of the photodiode 11 changes in a range of 1 nA to 10 μA, the output voltage Vout1 of the inverting amplifier 12 changes in proportion to the current Ip in a range of −1 mV (=−1 nA×1 MΩ) to −10 V (=−10 μA×1 MΩ). The operation in this range is the same as that in the related art.

In addition, the inverting amplifier 12 is saturated when the output current Ip of the photodiode 11 changes in a range of 10 μA to 100 mA, and the output voltage Vout1 is not changed from the saturation voltage. However, the output current of the photodiode 11 is bypassed while maintaining the electric potential at the anode side of the photodiode 11 as almost 0 V (forward electric potential of the diode) by electrical conduction of the diode 23.

For this reason, a current proportional to the input light intensity is output continuously from the photodiode 11, and a voltage drop occurring due to flowing of the current through the second resistor 21 appears at the output voltage Vout2 of the differential amplifier 22.

Accordingly, as shown in FIG. 2, when the output current Ip of the photodiode 11 changes in a range of 10 μA to 100 mA, the output voltage Vout2 of the differential amplifier 22 changes in proportion to the current Ip in a range of −1 mV (=−10 μA×100Ω) to −10 V (=−100 mA×100Ω).

Figure 3:
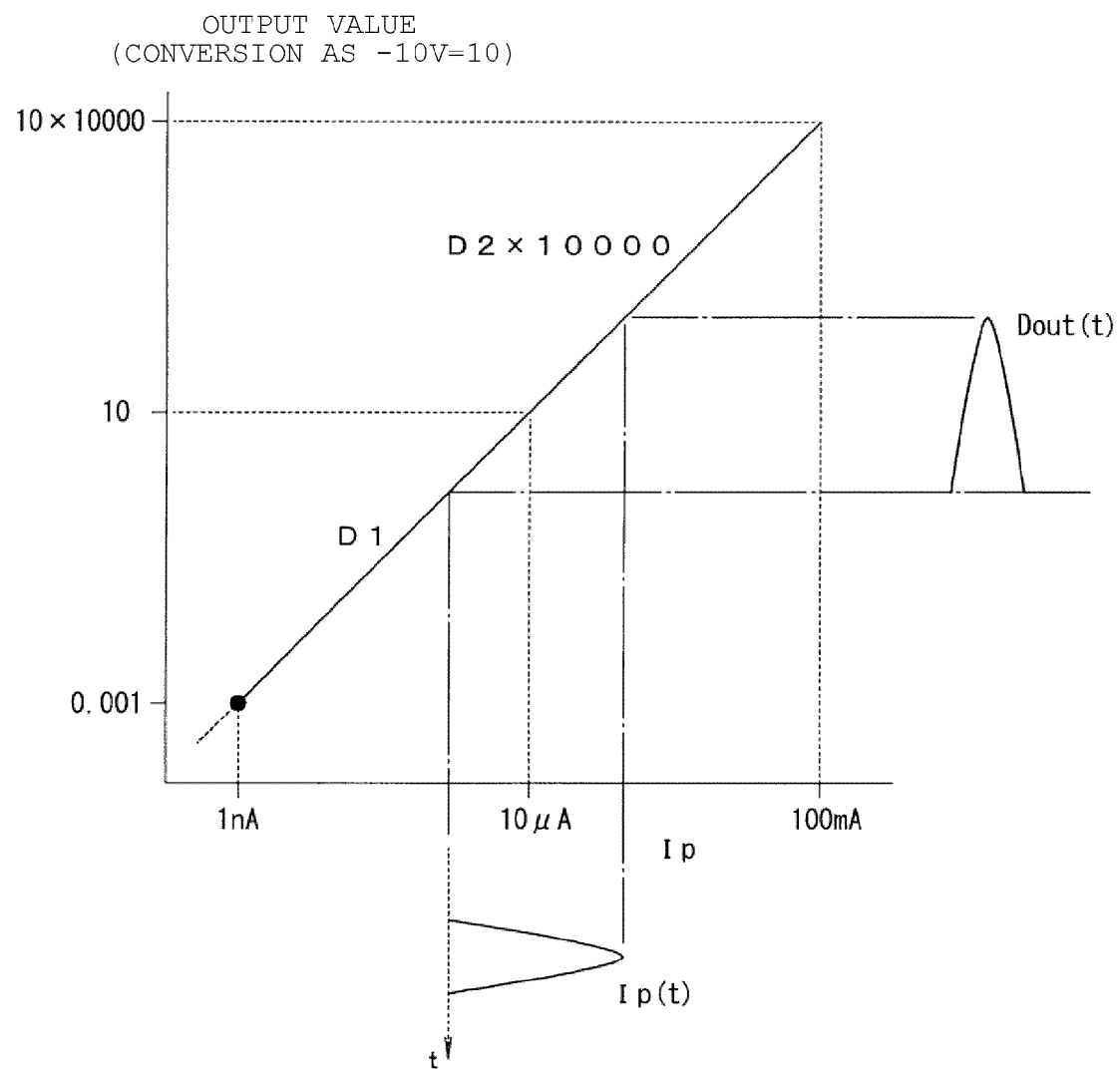
FIG. 3 is a view for explaining the entire operation of the first embodiment.

FIG. 3 is a view showing the relationship between the output current of the photodiode 11 of the photoelectric conversion circuit 20 and the final output. The digital value D1× magnification 1 becomes an effective output value in a range where the output current Ip is equal to or larger than 1 nA and smaller than 10 μA, and the digital value D2× magnification 10000 becomes an effective output value in a range where the output current Ip is equal to or larger than 10 μA and smaller than 100 mA. Accordingly, a wide range of $10^8$ times (equivalent to 80 dB in terms of power) the current Ip=1 nA to 100 mA is covered as a whole.

In addition, as described above, the output of the inverting amplifier 12 and the output of the differential amplifier 22 are output in parallel and only one of the outputs in a proper range is selectively output. Accordingly, even if Ip(t) changes so as to pass through 10 μA at the boundary of the range as shown in FIG. 3, the effective value is selected without delay and the voltage signal Dout(t) corresponding to the current is output.

(Second Embodiment)

In the above explanation, a configuration in which one of the output of the inverting amplifier 12 and the output of the differential amplifier 22 is selected as an effective value to facilitate understanding of the present invention has been used; however, the present invention is not limited to this.

Figure 4:
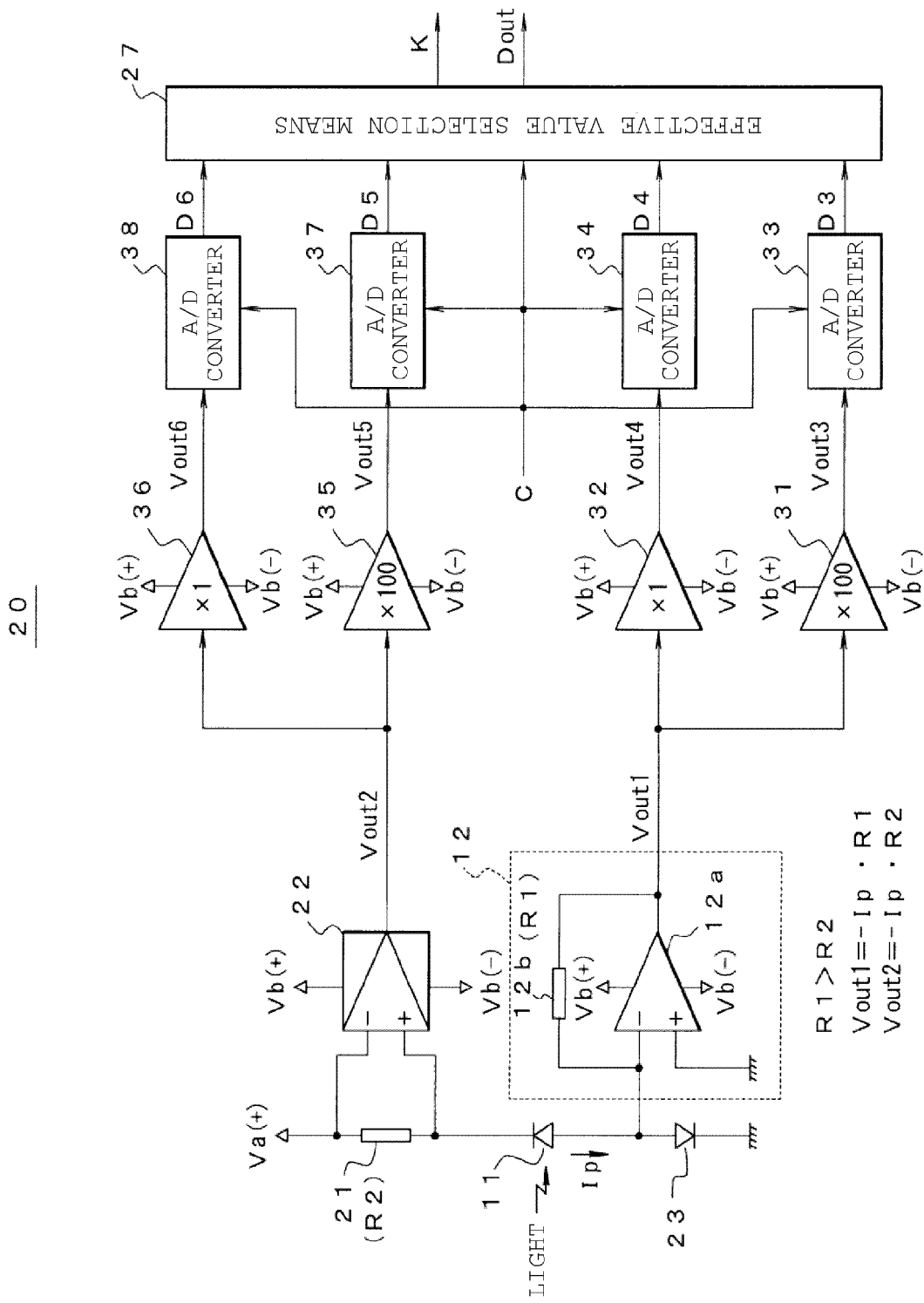
FIG. 4 is a view showing the configuration of a second embodiment.

For example, although the effective dynamic range of the operational amplifier 12a or the differential amplifier 22 is set to 10000 times (40 dB in terms of power) and the dynamic range of 80 dB is obtained at both sides in the above explanation, a configuration shown in FIG. 4 may also be considered in order to separate the lower limit (in the above example, −1 mV) of the effective output range of the amplifier from the noise level, in consideration of a problem of DC drift or noise of a signal input to an A/D converter.

That is, a common-mode amplifier 31 with a gain A (for example, set to A=100) and a common-mode amplifier 32 with a gain 1 (voltage follower may be omitted) are provided in parallel after the inverting amplifier 12, and outputs Vout3 and Vout4 of the amplifiers 31 and 32 are converted into digital values D3 and D4 by A/D converters 33 and 34, respectively.

In addition, a common-mode amplifier 35 with a gain A (=100) and a common-mode amplifier 36 with a gain 1 (voltage follower may be omitted) are provided in parallel after the differential amplifier 22, and outputs Vout5 and Vout6 of the amplifiers 35 and 36 are converted into digital values D5 and D6 by A/D converters 37 and 38, respectively. In addition, although the common-mode amplifiers 31, 32, 35, and 36 are used herein, the voltage of an input signal to each A/D converter may be converted to have a positive polarity using an inverting amplifier.

Figure 5:
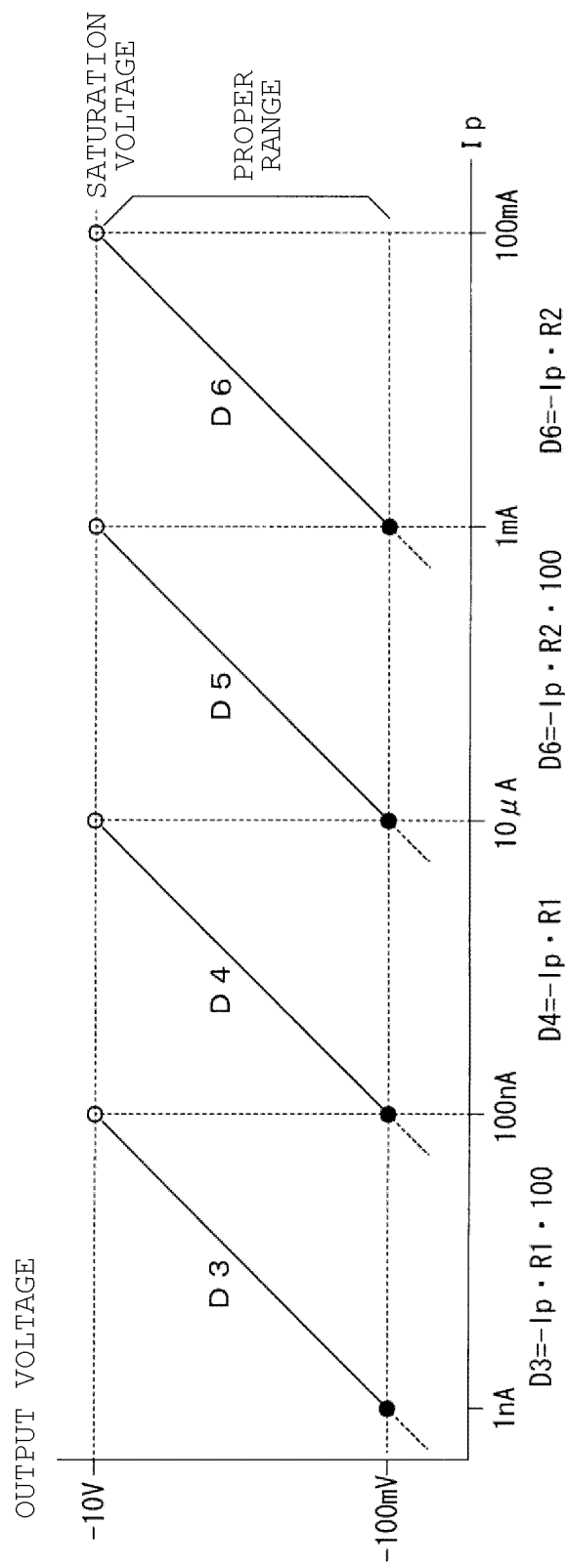
FIG. 5 is a view for explaining an operation of the second embodiment.
Figure 6:
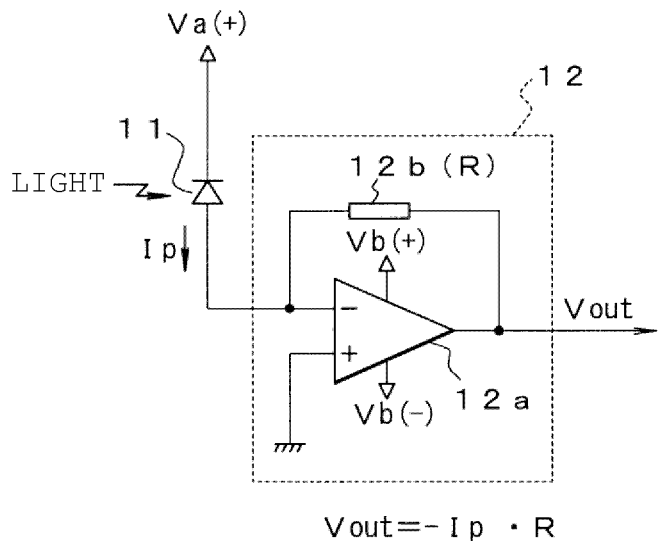
FIG. 6 is a view showing the basic configuration of an I/V conversion type photoelectric conversion circuit.
Figure 7:
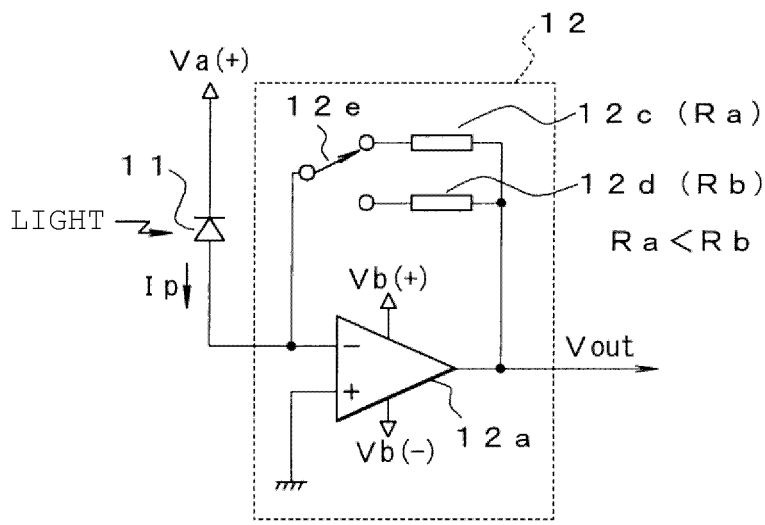
FIG. 7 is a view showing the configuration of a known photoelectric conversion circuit by which the dynamic range is expanded.

In this circuit, for example, the resistance value R1 of the first resistor 12b is set to 1 MΩ and the resistance value R2 of the second resistor 21 is set to 100Ω (α=10000) similar to those described above. Then, as shown in FIG. 5, in a range where the output current Ip of the photodiode 11 is 1 nA to 100 nA, the output Vout1 of the inverting amplifier 12 changes in proportion to the current Ip in a range of −1 mV to −100 mV and the output Vout3 of the common-mode amplifier 31 with a gain 100 changes in proportion to the current Ip in a range of −100 mV to −10 V.

Moreover, in a range where the output current Ip of the photodiode 11 is 100 nA to 10 μA, the output Vout1 of the inverting amplifier 12 changes in proportion to the current Ip in a range of −100 mV to −10 V and the output Vout4 of the common-mode amplifier 32 with a gain 1 changes in proportion to the current Ip in a range of −100 mV to −10 V.

Similarly, in a range where the output current Ip of the photodiode 11 is 10 μA to 1 mA, the output Vout2 of the differential amplifier 22 changes in proportion to the current Ip in a range of −1 mV to −100 mV and the output Vout5 of the common-mode amplifier 35 with a gain 100 changes in proportion to the current Ip in a range of −100 mV to −10 V.

Moreover, in a range where the output current Ip of the photodiode 11 is 1 mA to 100 mA, the output Vout2 of the differential amplifier 22 changes in proportion to the current Ip in a range of −100 mV to −10 mV and the output Vout6 of the common-mode amplifier 36 with a gain 1 changes in proportion to the current Ip in a range of −100 mV to −10 V.

In addition, in a range where the output current Ip of the photodiode 11 exceeds 10 μA, the inverting amplifier 12 is saturated as described above. In this case, however, since the output current of the photodiode 11 is bypassed through the diode 23, a current proportional to the input light intensity is continuously obtained.

The outputs of the common-mode amplifiers 31, 32, 35, and 36 are converted into digital values D3 to D6 by A/D converters 33, 34, 37, and 38, respectively, and are input to the effective value selection means 27 similar to those described above. Then, one of the values included in a proper range (in this case, the absolute value is equal to or larger than 100 mV and smaller than 10 V) is selected as the effective value Dout and is then output as the effective value Dout together with the magnification information K.

As the magnification information K, for example, 2-bit data of "00" indicating the magnification 1 is output when the digital value D3 is selected as an effective value, 2-bit data of "01" indicating the magnification 100 is output when the digital value D4 is selected as an effective value, 2-bit data of "10" indicating the magnification 10000 is output when the digital value D5 is selected as an effective value, and 2-bit data of "11" indicating the magnification 1000000 is output when the digital value D6 is selected as an effective value.

Thus, when the common-mode amplifiers 31, 32, 35, and 36 are connected after the inverting amplifier 12 and the differential amplifier 22, the effective output range (that is, a range of effective input to an A/D converter) of each of the common-mode amplifiers 31, 32, 35, and 36 becomes a relatively narrow range of 10 V to 100 mV as shown in FIG. 5. This is less sensitive to DC drift, noise, and the like.

In addition, since the input range is divided by four amplifiers (the inverting amplifier 12, the differential amplifier 22, and the common-mode amplifiers 31 and 35), it is possible to enlarge the dynamic range while reducing the influence of DC drift, noise, and the like, compared with a configuration in which the input range is divided only with the outputs of the inverting amplifier 12 and the differential amplifier 22.

The numerical example of the above-described embodiment is also an example, and does not limit the present invention. In addition, since the common-mode amplifiers 32 and 36 with a gain 1 are voltage followers, these amplifiers 32 and 36 may be omitted.

In the above circuit, the ratio α between the resistance value R1 of the first resistor 12b and the resistance value R2 of the second resistor 21 is R1/R2=10000. This is equivalent to the width (10 μA/1 nA=10000) of the entire input range at the side of the inverting amplifier 12 and the width (100 mA/10 μA=10000) of the entire input range at the side of the differential amplifier 22. In this embodiment, each width is covered by the common-mode amplifier with a gain 100 and the common-mode amplifier with a gain 1. However, the width of the input range at each of the inverting amplifier side and the differential amplifier side may be set to correspond to the resistance ratio α=R1/R2, and the same photoelectric conversion processing is possible in other numerical examples.

Moreover, in the embodiment described above, a configuration is adopted in which the effective value is selected from the output of the inverting amplifier 12 and the output of the differential amplifier 22 or from their amplified outputs and is output together with the magnification information. However, the output form is arbitrary, various changes may also be made according to a processing method of an apparatus which uses the photoelectric conversion circuit. For example, a case may be considered of calculating the intensity of incident light by converting the output of the inverting amplifier 12 and the output of the differential amplifier 22 into digital values for a fixed period by an A/D converter, storing the digital values in a memory, and by applying the weight equivalent to the magnification to the stored data.

[Description of Reference Numerals and Signs]

11: photodiode
12: inverting amplifier
12a: operational amplifier
12b: first resistor
20: photoelectric conversion circuit
21: second resistor
22: differential amplifier
23: diode
25, 26, 33, 34, 37, 38: A/D converter
31, 32, 35, 36: common-mode amplifier
27: effective value selection means

The invention claimed is:

1. A photoelectric conversion circuit having a photodiode which has a cathode connected to a positive side of a power supply and which receives incident light and emits a current corresponding to the intensity from an anode side and an inverting amplifier which includes an operational amplifier having a non-inverting input terminal grounded and a first resistor connected between an output terminal and an inverting input terminal of the operational amplifier and which outputs a voltage whose absolute value is equal to a product of an output current of the photodiode and a resistance value of the first resistor, the inverting input terminal of the operational amplifier being connected to the anode of the photodiode, comprising;

a second resistor which has a smaller resistance value than the first resistor and which is inserted between the positive side of the power supply and the cathode of the photodiode;

a differential amplifier which outputs a voltage whose absolute value is being equal to a potential difference between both ends of the second resistor; and a diode which has an anode connected to a connection point between the anode of the photodiode and the inverting input terminal of the operational amplifier and a cathode grounded and which, when the output current of the photodiode has not reached a level which saturates an output of the inverting amplifier, changes to a non-conductive state since a voltage of the inverting input terminal of the operational amplifier is lower than a forward voltage drop unique to the diode and, when the output current of the photodiode reaches the level which saturates the output of the inverting amplifier, changes to a conductive state since the voltage of the inverting input terminal of the operational amplifier is higher than the forward voltage drop so that the output current of the photodiode is bypassed.

* * * * *